United States Patent
Horning et al.

(10) Patent No.: US 7,542,858 B2
(45) Date of Patent: Jun. 2, 2009

(54) SIMULATED BATTERY LOGIC TESTING DEVICE

(75) Inventors: Randall F. Horning, Longmont, CO (US); Edde Tin Shek Tang, Louisville, CO (US); Del Fafach, Jr., Louisville, CO (US)

(73) Assignee: LSI Corporation, Milpitas, CA (US)

( * ) Notice: Subject to any disclaimer, the term of this patent is extended or adjusted under 35 U.S.C. 154(b) by 172 days.

(21) Appl. No.: 11/145,366

(22) Filed: Jun. 3, 2005

(65) Prior Publication Data

US 2006/0273800 A1 Dec. 7, 2006

(51) Int. Cl.
*G01R 31/36* (2006.01)
*G06F 19/00* (2006.01)

(52) U.S. Cl. .................. 702/63; 324/73.1; 324/426; 324/433; 324/527; 340/636.1; 340/636.19; 702/57; 702/60; 702/108; 703/3; 703/4; 703/12; 703/18

(58) Field of Classification Search ............... 324/73.1, 324/76.11, 425, 426, 433, 500, 527, 537, 324/771; 340/500, 540, 635, 636.1, 636.12, 340/636.13, 636.15, 636.19; 702/1, 57, 60, 702/63, 64, 108, 117, 124, 127, 189; 703/3, 703/4, 13, 18
See application file for complete search history.

(56) References Cited

U.S. PATENT DOCUMENTS

| | | | | |
|---|---|---|---|---|
| 2,950,437 A * | 8/1960 | Stahl | | 324/73.1 |
| 2,996,666 A * | 8/1961 | Shields | | 324/73.1 |
| 3,082,374 A * | 3/1963 | Buuck | | 324/73.1 |
| 3,219,927 A * | 11/1965 | Topp, Jr. et al. | | 714/735 |
| 3,413,536 A * | 11/1968 | Webb | | 320/116 |
| 3,487,304 A * | 12/1969 | Kennedy | | 324/73.1 |
| 5,744,932 A * | 4/1998 | Kissel | | 320/106 |
| 6,211,681 B1 * | 4/2001 | Kagawa et al. | | 324/426 |

* cited by examiner

*Primary Examiner*—Edward R Cosimano
(74) *Attorney, Agent, or Firm*—Cochran Freund & Young LLC

(57) ABSTRACT

A simulated battery test device and method that is capable of testing a battery charging circuit and logic circuit to determine proper operation. An operational amplifier is used that can both source and sink current to simulate the operation of the battery. A battery low signal can be generated using the simulated battery test device to test a battery charging circuit and logic circuit in a battery low condition. In addition, a battery open signal can be generated to test the battery charging and logic circuit in a battery open condition. Charging currents are detected to determine if currents fall within an acceptable range.

6 Claims, 3 Drawing Sheets

SIMULATED BATTERY LOGIC TESTING DEVICE

BACKGROUND OF THE INVENTION a. Field of the Invention

The present invention pertains generally to test devices and more particularly to a simulated battery logic testing device.

b. Description of the Background

Many devices use battery backups to protect against electrical line failure. Battery charging circuits in such systems include logic that controls the charging circuit. For example, voltage and current regulation are controlled in the battery charging circuit, as well as detection of electrical line loss and switchover to battery operation. If the logic in the battery charging circuit fails, a battery switchover may not occur when needed, or a battery may not be charged as needed. Functional test devices have been unable to effectively and automatically test battery charging logic circuitry in the past, relying on actual batteries in the test function which become unreliable after repeated use.

SUMMARY OF THE INVENTION

An embodiment may therefore comprise a method of simulating a battery to test the operation of a battery charging circuit and logic circuitry comprising: generating a low simulated battery voltage using an operational amplifier by generating an output voltage at an output of the operational amplifier that is lower than a desired battery charging voltage; determining if the logic circuitry has detected the low simulated battery voltage; measuring current generated by the battery charging circuit by measuring the voltage drop across a resistor and generating a current charging signal; comparing the current measurement signal to a range of acceptable current charging values; generating a battery open condition using the operational amplifier by turning off the operational amplifier; determining if the logic circuitry has detected the battery open condition.

This embodiment may further comprise attaching a load to the simulated battery test device; detecting an amount of current necessary to drive the load; comparing the amount of current necessary to drive the load with a range of acceptable currents.

An embodiment may further comprise a simulated battery test device for checking the operation of a battery charging circuit and logic/memory device comprising: an operational amplifier that generates a low simulated battery voltage in response to a battery low control signal that is used to adjust a reference voltage to the low simulated battery voltage, and that generates a battery open condition in response to a battery open control signal that is used to turn off the operational amplifier; a resistor that is connected in-line with the battery charging circuit; a comparator connected across the resistor that measures a voltage drop across the resistor that is representative of a current charging signal generated by the battery charging circuitry, and that generates a voltage difference signal that is proportional to the voltage drop across the resistor; an analog to digital converter that generates a digital signal, using a reference voltage, the digital signal being representative of the magnitude of the current charging signal.

This embodiment may further comprise a load connected to the simulated battery test device that causes the simulated battery test device to generate a current hold-up signal that is measured by the resistor, the comparator and the analog to digital converter to determine if the current hold-up signal is within a predetermined range of values.

An embodiment may further comprise a system of simulating a battery to test the operation of a battery charging circuit and logic circuitry associated with the battery charging circuit comprising: means for generating a low simulated battery voltage using an operational amplifier by generating an output voltage at an output of the operational amplifier that is lower than a desired battery charging voltage; means for determining if the logic circuitry has detected the low simulated battery voltage; means for measuring current generated by the battery charging circuit by measuring the voltage drop across a resistor and generating a current charging signal; means for comparing the current measurement signal to a range of acceptable current charging signals; means for generating a battery open condition using the operational amplifier by turning off the operational amplifier; means for determining if the logic circuitry has detected the battery open condition.

This embodiment may further comprise means for loading the simulated battery test device; means for detecting an amount of current necessary to drive the means for loading; means for comparing the amount of current necessary to drive the means for loading with a range of acceptable currents.

DETAILED DESCRIPTION OF VARIOUS EMBODIMENTS

Figure 1:
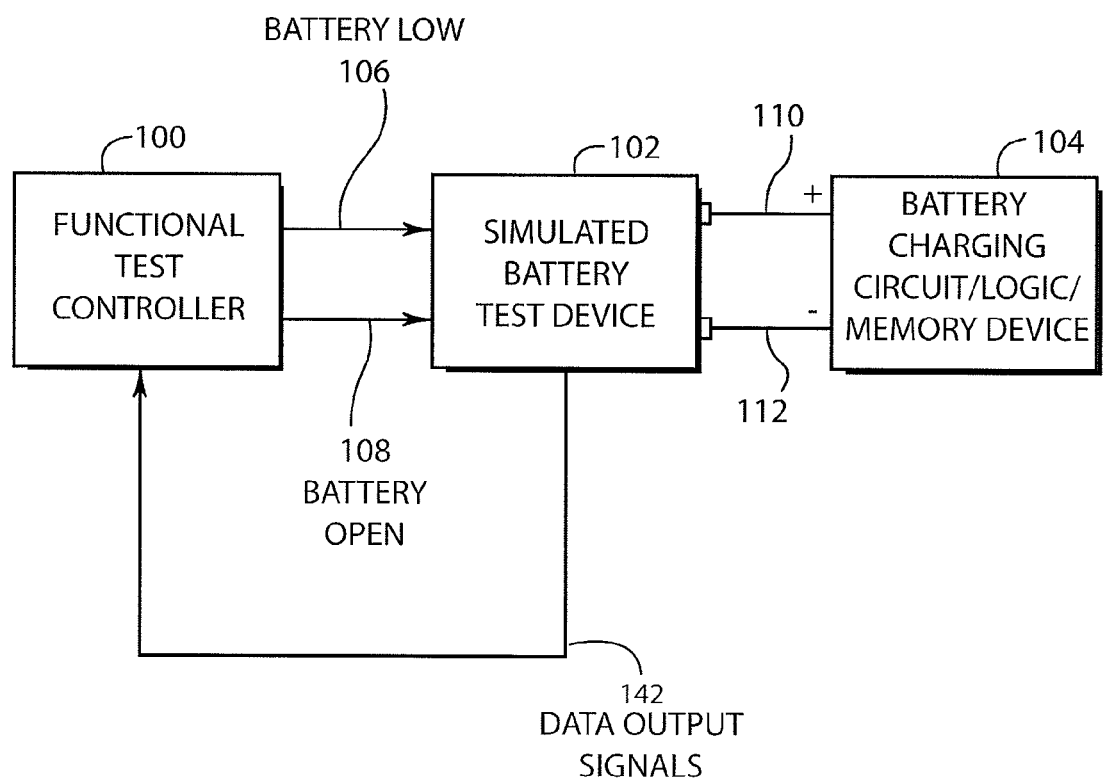
FIG. 1 is a schematic block diagram illustrating the present invention.

FIG. 1 is a schematic block diagram illustrating an embodiment of the invention. As shown in FIG. 1 a functional test controller 100 is operatively connected to a simulated battery test device 102. The functional test controller generates a battery low signal 106 that is applied to the simulated battery test device 102 and a battery open signal 108 that is also applied to the simulated battery test device 102. The simulated battery test device 102 is connected to a battery charging circuit/logic/memory device 104 by way of a positive terminal 110 and a negative terminal 112. The simulated battery test device 102 generates data output signal 142 that provides data to the functional test controller 100 relating to certain tests performed on the battery charging circuit/logic/memory device 104. The simulated battery test device 102 simulates the functions of a battery that would otherwise be connected to the battery charging circuit/logic/memory device 104. The simulated battery test device 102 can generate a battery low condition by application of the battery low signal 106 from the functional test controller 100. In addition, the simulated battery test device 102 can simulate an open battery, i.e., a dead battery or a battery that is not connected to the battery charging circuit 104, by application of the battery open signal 108 from the functional test controller 100.

Figure 2:
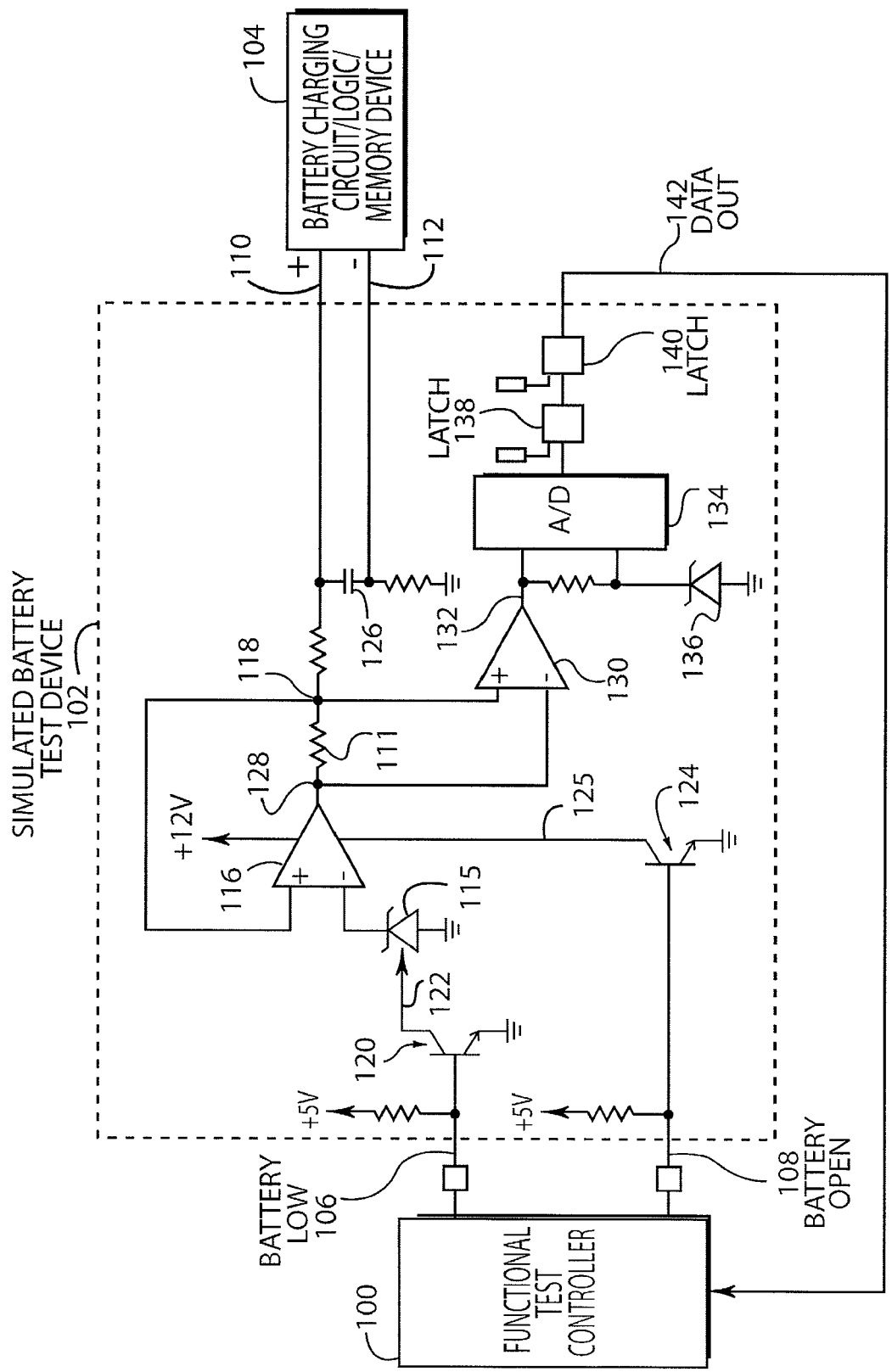
FIG. 2 is a schematic circuit diagram illustrating the present invention.

FIG. 2 is a circuit diagram illustrating one embodiment of a simulated battery test device 102. As shown in FIG. 2, the functional test controller 100 generates a battery low signal 106 that is used to simulate a low battery voltage. Zener diode 115 sets a reference voltage at the negative input of operational amplifier 116. The zener diode voltage is selected to generate a low battery voltage or a fully charged battery voltage to the battery charging circuit 104. The voltage, for example, may be 4.76 volts in one embodiment for a fully charged battery voltage. Because of the feedback loop of the operational amplifier, the voltage at node 118 settles at the same voltage as the negative input to the operational amplifier 116, i.e., 4.76 volts. Hence, the voltage at node 118 should substantially match a fully charged battery voltage that is applied to the battery charging/logic/memory device 104.

As also shown in FIG. 2, when the battery low signal 106 is applied to the simulated battery test circuit 102 by the functional test controller 100, a low battery voltage is generated at node 118. The application of the battery low signal 106 causes the transistor 120 to turn on. When transistor 120 turns on, it generates a control signal 122 that is applied to the zener diode 115 causing the voltage drop across the zener diode to drop to 3.96 volt, i.e., a low battery voltage in one embodiment. The voltage at node 118 then settles at the new voltage of 3.96 volts (the low battery voltage), which is a lower voltage than the previous voltage of 4.76 volts (fully charged battery voltage). Hence, operational amplifier 116 generates a low battery voltage condition at node 118. The logic in device 104 then detects the low voltage condition. Since 3.96 volts is too low to operate, an error condition is generated. For example, in a RAID controller, that includes a battery charging/logic/memory device, such as device 104, an error flag can be generated indicating an error condition in the RAID logic controller. The battery charging circuit 104 will then initiate a charge cycle in an attempt to charge the battery to the correct value.

Referring again to FIG. 2, functional test controller 100 can also generate a battery open signal 108. The normal operation is with the battery open signal 108 deasserted. In this state, transistor 124 is turned off and the remote shutdown pin 125 on operational amplifier 116 is not enabled. When the functional test controller 100 drives the battery open signal 108, transistor 124 is turned on and the remote shutdown pin 125 on operational amplifier 116 is enabled since transistor 124 grounds pin 125. When this happens, the output stage of the operational amplifier 116 is turned off which creates an open. In other words, it appears that the simulated battery test device 102 is an open circuit which simulates that a battery is not connected to the battery charging/logic/memory device 104. The logic circuitry of the battery charging/logic/memory device 104 can then be checked to determine if the logic circuitry has detected a battery open condition. If the logic circuitry of the battery charging/logic/memory device 104 does not detect a battery open condition, it is an indication of a failure in the logic circuitry.

As disclosed above, the functional test controller 100 generates a battery low signal 106 and a battery open signal 108 to test the logic circuitry of the battery charging/logic/memory device 104 to determine proper operation. The simulated battery test device 102 is also capable of testing the battery charging circuit 104, as disclosed below. In this mode of operation, the current flows in FIG. 2 from right to left, rather than from left to right, in the mode disclosed above which tests the logic circuitry. This test is to determine whether the battery charging circuit 104 is capable of properly charging the battery and generating the right amount of charging current within a certain range of values.

To test the battery charging circuit, the battery low signal 106 is asserted. When the low voltage is detected by the logic circuit of the battery charging/logic/memory device 104, the charging circuit 104 initiates a charge cycle in an attempt to charge the simulated battery test device 102, which appears to the battery charging/logic/memory device 104 as a partially discharged battery, to a fully charged state. At this time, the charging circuit begins sourcing current to the simulated battery test device 102 in a charge cycle. The battery charging circuit 104 generates a DC signal that drives current into the simulated battery test device 102 that would normally be used to charge a battery. Since the signal is a DC signal, capacitor 126 isolates the positive and negative terminals of the battery charger, and the negative input 112 of the battery charger essentially goes to ground potential. The battery positive output 110 drives current through resistor 111 which causes a voltage drop between node 118 and node 128. The voltage drop across resistor 111 is then applied to comparator 130. Comparator 130 compares the voltages from each side of the resistor 111, i.e., the voltage drop from node 118 to node 128. Comparator 130 generates a difference voltage signal 132 that is applied to the analog to digital (A/D) converter 134. The A/D converter uses a zener diode 136 that provides a reference voltage so that the difference voltage 132 can be digitized to a known voltage range.

Since the resistance value of resistor 112 is known, and the voltage level of the difference voltage 132 is known and digitized in the A/D converter 134, the amount of current generated by the battery charging circuit 104 can be determined. Latches 138 and 140 buffer out any metastability in the signal for reading by the functional test controller 100. The functional test controller 100 controls the latching of latches 138, 140 that guarantee an accurate data output signal 142. The functional test controller 100 then reads the data out signal 142 to determine if the current generated by the battery charging circuit 100 is within an acceptable range to verify that the correct charging current is being generated by the battery charging circuit 104. After the charging circuit 104 has been verified as to proper operation, the battery low signal 106 is deasserted to put the simulated battery test device 102 in normal operation.

The functional test controller 100 then places the simulated battery test device 102 in a forced battery holdup condition by removing power from the battery charging/logic/memory device 104. In this mode, the simulated battery test device 102 provides current to an onboard load, such as a memory device in a RAID system (not shown). Again, a reading of the current being sourced by the simulated battery test device 102 is detected by detecting the voltage drop across resistor 112. The voltage drop across 112 is detected by comparator 130, that generates a voltage difference signal 132 which is an absolute digital value signal produced by A/D converter 134. This signal is applied to latches 138, 140, and a data output signal 142 is generated indicating the amount of current sourced by the simulated battery test device 102. The functional test controller 100 compares the source current value against an acceptable range of values for the particular memory load in the controller. If the source current value falls within the proper range, the controller load is acceptable.

Figure 3:
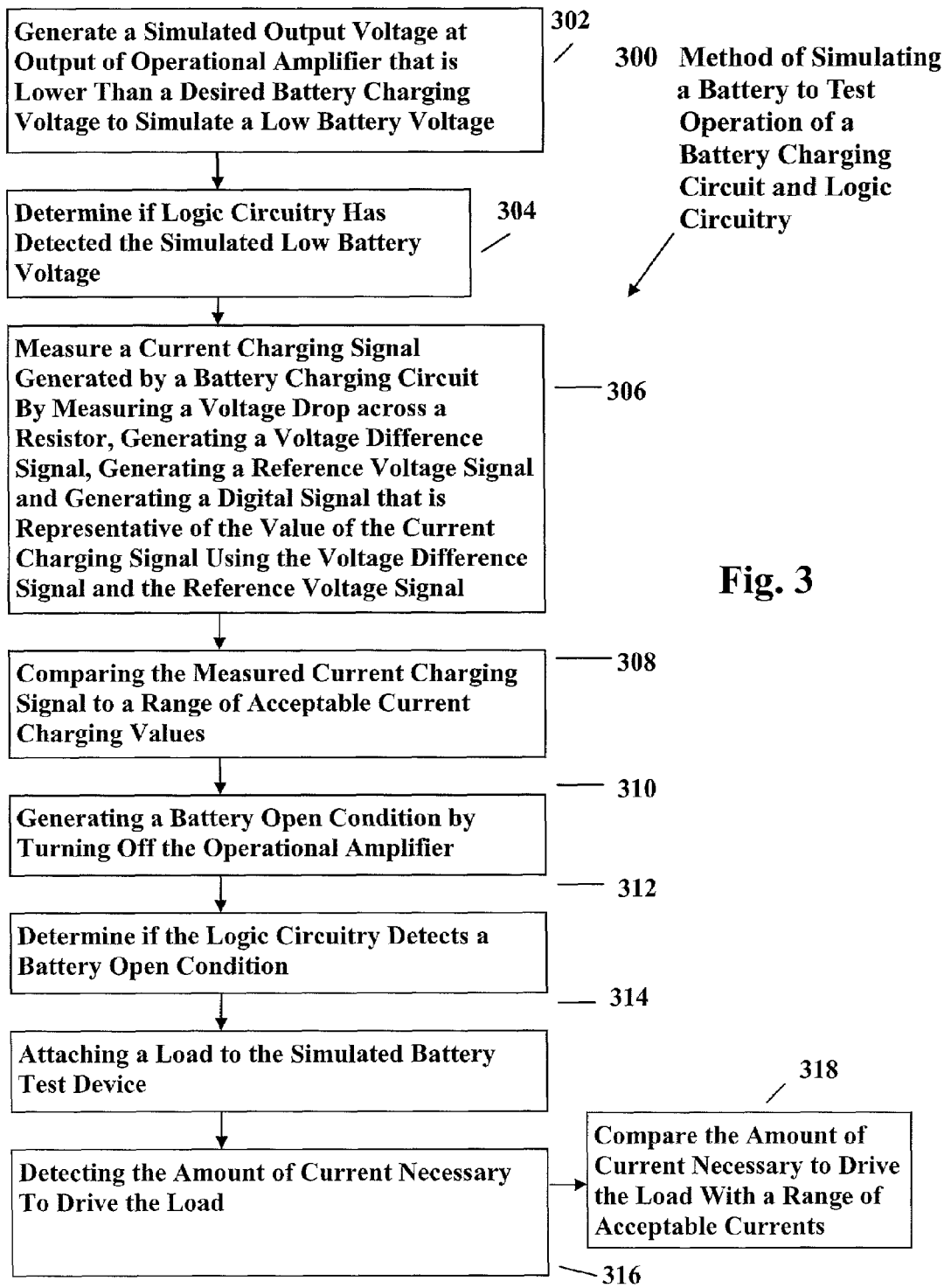
FIG. 3 is a flow diagram illustrating functions performed by the embodiment of FIGS. 1 and 2.

FIG. 3 is a flow diagram 300 illustrating the method of simulating a battery using a battery simulation device to test operation of the battery charging circuit and logic circuit 104. As illustrated in FIG. 3, at step 302, the simulated battery test device 102 generates an output voltage at the output node 128 of the operational amplifier 116 that is lower than a desired battery charging voltage to simulate a low battery voltage. At step 304, it is determined if the logic circuitry has detected the simulated low battery voltage. At step 306, a current charging signal generated by the battery charging circuit 104 is measured by measuring the voltage drop across resistor 111 generating the voltage difference signal between nodes 118 and 128 that is applied to the comparator 130, generating a reference voltage signal using zener diode 136 and generating a digital output signal 142 that is representative of the value of the current charging signal based upon the voltage difference signal that is applied to the comparator 130 and the reference voltage signal 136. At step 308, the measured current charging signal is compared with a range of acceptable charging values by functional test controller 100. At step 310, a battery open condition is generated by function test controller 100, generating a battery open signal 108 that turns off the operational amplifier 116 by grounding input 125 to the operational amplifier 116. At step 312, the functional test controller 100 determines if the logic circuitry of the battery charging/logic and memory device 104 has detected a battery open condition. At step 314, a load is attached to the simulated test battery device 102. At step 316, the amount of current necessary to drive the load is detected by the functional test controller 100. At step 318, functional test controller 100 then compares the amount of current necessary to drive the load with a range of acceptable currents.

The present invention therefore provides a unique simulated battery test device that is capable of testing both battery charging circuits and logic circuits in the battery charging circuit to determine proper operation. The simulated battery logic testing device provides a predictable and reliable test mechanism for verification of the battery support logic.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of simulating a battery to test the operation of a battery charging circuit and logic circuitry comprising:
   generating a low simulated battery voltage using an operational amplifier by generating an output voltage at an output of said operational amplifier that is lower than a desired battery charging voltage;
   determining if said logic circuitry has detected said low simulated battery voltage;
   measuring current generated by said battery charging circuit by measuring the voltage drop across a resistor and generating a current charging signal;
   comparing said current measurement signal to a range of acceptable current charging values;
   generating a battery open condition using said operational amplifier by turning off said operational amplifier;
   determining if said logic circuitry has detected said battery open condition.

2. The method of claim 1 wherein said process of measuring current generated by said battery charging circuit further comprises:
   generating a voltage difference signal that is proportional to said current charging signal;
   generating a reference voltage signal;
   generating a digital signal that is representative of the value of said current charging signal using said voltage difference signal and said reference voltage signal.

3. The method of claim 1 further comprising:
   attaching a load to said simulated battery test device;
   detecting an amount of current necessary to drive said load;
   comparing said amount of current necessary to drive said load with a range of acceptable currents.

4. A system of simulating a battery to test the operation of a battery charging circuit and logic circuitry associated with said battery charging circuit comprising:
   means for generating a low simulated battery voltage using an operational amplifier by generating an output voltage at an output of said operational amplifier that is lower than a desired battery charging voltage;
   means for determining if said logic circuitry has detected said low simulated battery voltage;
   means for measuring current generated by said battery charging circuit by measuring the voltage drop across a resistor and generating a current charging signal;
   means for comparing said current measurement signal to a range of acceptable current charging signals;
   means for generating a battery open condition using said operational amplifier by turning off said operational amplifier;
   means for determining if said logic circuitry has detected said battery open condition.

5. The system of claim 4 further comprising:
   means for loading said simulated battery test device;
   means for detecting an amount of current necessary to drive said means for loading;
   means for comparing said amount of current necessary to drive said means for loading with a range of acceptable currents.

6. The system of claim 4 wherein said means for measuring current generated by said battery charging circuit further comprises:
   means for generating a voltage difference signal that is proportional to said current charging signal;
   means for generating a reference voltage signal;
   means for generating a digital signal that is representative of the value of said current charging signal using said voltage difference signal and said reference voltage signal.

* * * * *